United States Patent [19]

Manners

[11] 4,178,536

[45] Dec. 11, 1979

[54] DUAL-MODE HORIZONTAL OUTPUT STAGE

[75] Inventor: David E. Manners, Alexander, N.Y.

[73] Assignee: GTE Sylvania Incorporated, Stamford, Conn.

[21] Appl. No.: 933,219

[22] Filed: Aug. 14, 1978

[51] Int. Cl.$^2$ .................... H01J 29/70; H01J 29/76
[52] U.S. Cl. ........................... 315/408; 315/411
[58] Field of Search ............... 315/408, 411, 396, 397; 358/190

[56] References Cited

U.S. PATENT DOCUMENTS

| | | | |
|---|---|---|---|
| 3,621,134 | 11/1971 | Waring | 358/190 |
| 3,752,903 | 8/1973 | Newman et al. | 358/190 |
| 3,814,851 | 6/1974 | Nakagawa et al. | 358/190 |
| 3,891,892 | 6/1975 | Bohringer | 315/411 |

Primary Examiner—Theodore M. Blum
Attorney, Agent, or Firm—John A. Odozynski

[57] ABSTRACT

A horizontal output stage including a switching device for coupling the input of the horizontal output transistor to a feedback network and bias means during startup and to the secondary of an interstage coupling transformer during steady-state operation. During startup the output transistor operates in an oscillatory mode thereby developing an alternating current in the flyback transformer. The supply voltage for the horizontal oscillator is derived from a winding on the flyback transformer. Once this supply voltage reaches the value required for sustained operation of the oscillator, the switching device disconnects the output transistor from the feedback network and couples it to the interstage transformer so that the output transistor is driven by the signal developed by the horizontal oscillator.

15 Claims, 2 Drawing Figures

DUAL-MODE HORIZONTAL OUTPUT STAGE

CROSS REFERENCE TO A RELATED APPLICATION

Cross reference is made to a related application entitled "A Power Saving Circuit" by the same inventor as this application, David E. Manners, filed on the same date and assigned to the same assignee as this application.

FIELD OF THE INVENTION

This invention relates to horizontal deflection circuitry for television receivers and more particularly to startup scheme for systems having a horizontal oscillator powered by a voltage supply derived from the flyback transformer.

BACKGROUND OF THE INVENTION

Because of its attendant size, weight and cost, it has been occasionally found preferable to circumvent the use of an input line-isolation transformer in the design of television receivers. In such receivers, commonly referred to as "hot-chassis" receivers, the necessary voltage supplies are then directly derived from the AC line and returned to an AC or "Hot" ground. Typically, the AC line voltage is rectified and filtered to produce an unregulated output voltage of an amplitude necessarily dependent on the peak AC line voltage. In the receiver to be described below, this unregulated voltage is approximately 165 volts. The unregulated voltage may then be regulated or otherwise tailored to provide the necessary voltages for various portions of the receiver's circuitry. For example, as described below, the unregulated 165 volts is regulated to provide the 112-volt Horizontal B+ required by the horizontal output stage. Other parts of the receiver, for example, the tuner, video, sound and horizontal and vertical oscillator circuitry may require voltages in the range of 10 to 30 volts. In a conventional design the Horizontal B+ may be dropped simply through a dropping resistor or a series-pass transistor in order to develop the desired voltages. However, it is obvious to those skilled in the art that the voltage dropped, and hence power dissipated, across the resistor or series-pass transistor represents wasted energy to the extent that it serves no useful purpose in the operation of the receiver. In addition to wasting energy, this power dissipation results in the generation of sufficient heat in the receiver cabinet to cause thermal stress to other components as well as possible premature failure.

The subject invention represents a novel concept for supplying the lower voltages required by the receiver's circuitry while conserving energy to substantially the maximum extent possible. The essence of the concept is to provide additional secondary windings on the flyback transformer so as to develop these voltages. The alternating current developed by the horizontal output transistor in the flyback primary induces voltages in these secondary windings that can be rectified and filtered to effect the desired voltages.

Obviously, in order for the circuitry that is powered from the flyback secondary windings to be operational, there must be a signal developed in the flyback primary; that is, the horizontal oscillator must be operating. Consequently, the power supply for the oscillator cannot be solely dependent on the voltage induced in a flyback secondary winding. As before, the Horizontal B+ can be conveniently used to power the oscillator. However, since the Horizontal B+ is typically on the order of 100 V. and the voltage required by the oscillator may be approximately 20 V., the Horizontal B+ must be dropped through, for example, a dropping resistor or series-pass transistor. In so doing a significant amount of power will necessarily be dissipated across the resistor or transistor. A considerably more desirable configuration would allow the oscillator also to be powered from a flyback secondary winding of an appropriate voltage.

OBJECTS OF THE INVENTION

It is a primary object of this invention to provide a power supply for a horizontal oscillator in a television receiver having substantial portions of its circuitry powered by voltages derived from flyback secondary windings.

It is a further object of this invention to provide such a supply with a minimal expenditure of input power.

It is a further object of this invention to also power the horizontal oscillator from a voltage source derived from a flyback secondary winding.

It is a further object of this invention to provide such a flyback-derived supply while assuring startup of the horizontal deflection system.

SUMMARY OF THE INVENTION

The above and other objects and advantages are achieved in one aspect of this invention by a horizontal output stage comprising an output device coupled through the flyback transformer to a voltage source derived from the AC line. The output device is returned to a Hot ground. A switching device has a common terminal coupled to the output device and a control terminal coupled to a source of voltage derived from another flyback winding. An NO terminal of the switching device is coupled to a horizontal interstage coupling means. An NC terminal is connected to a bias means and to a feedback network coupled to the flyback primary winding. During startup the output device is connected to the NC terminal so that it operates in an oscillatory mode. During steady-state the output device is connected to the NO terminal so that it operates in a substantially switching mode, driven by the horizontal oscillator.

DETAILED DESCRIPTION OF THE PREFERRED EMBODIMENTS

For a better understanding of the present invention, together with other and further objects, advantages and capabilities thereof, reference is made to the following disclosure and appended claims in connection with the above description of some of the aspects of the invention.

Figure 1:
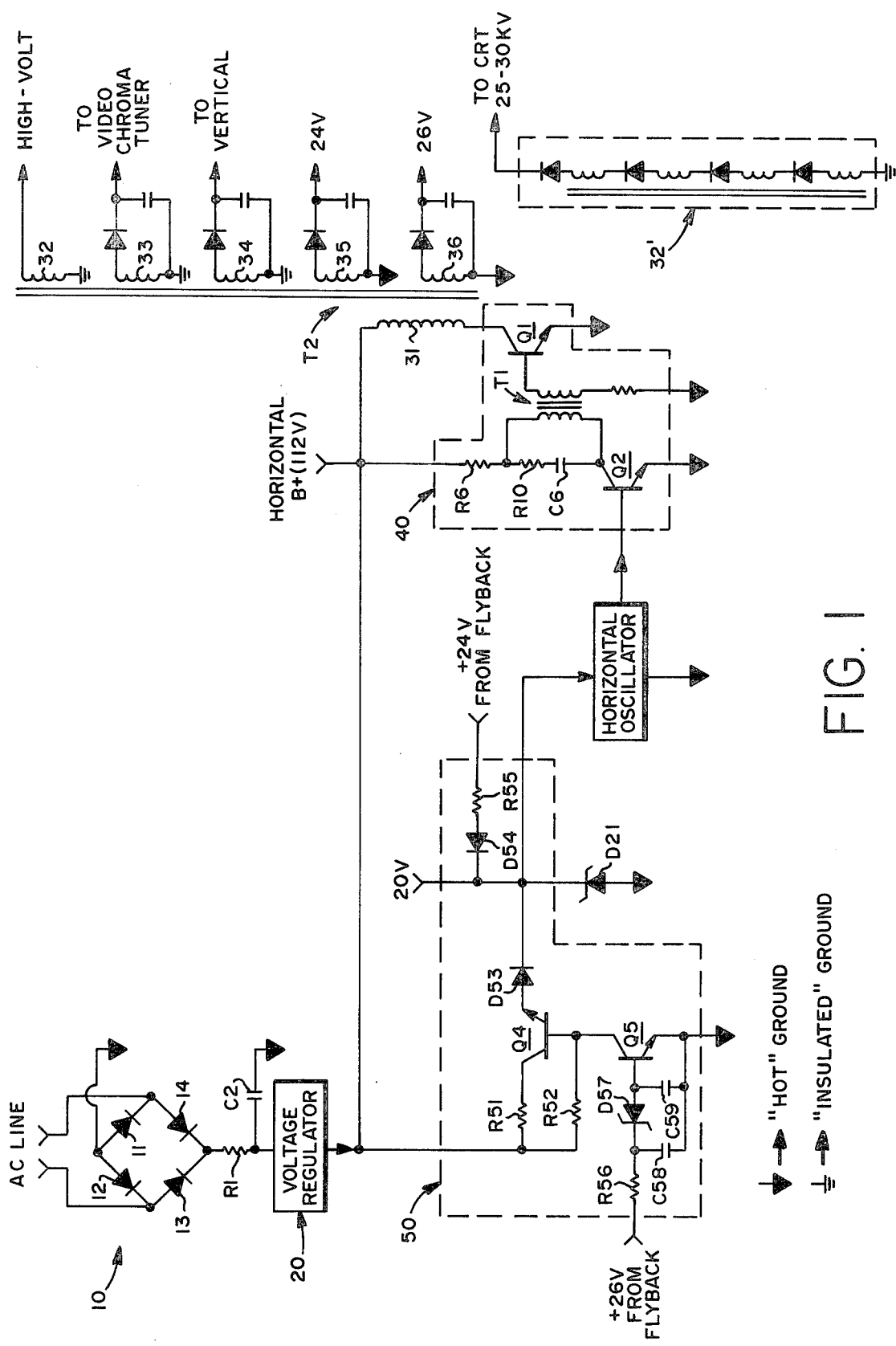
FIG. 1 is a schematic diagram, partially in block form, of an Iso-Hot type television receiver that effects startup by switching the horizontal oscillator power supply.

Referring now to FIG. 1, an input voltage is developed by a voltage source including an input voltage supply 10 and a voltage regulator 20. An unregulated voltage is derived from the AC line by a rectifier comprising diodes 11, 12, 13 and 14 and an RC filter circuit comprising a resistor R1 and a capacitor C1. Although a full-wave, bridge-type rectifier is shown in FIG. 1, other types of rectifiers may be used depending on the receiver's requirements. The input current to the rectifier is drawn from and returned to the AC line, thereby effecting an AC or a "Hot" ground return. Similarly, the RC filter is connected between the output of the rectifier and ground.

Voltage supply 10 supplies a nominal unregulated voltage of approximately 165 volts to a voltage regulator 20. A regulated voltage, hereinafter referred to as Horizontal B+, appears at the output of regulator 20.

This voltage comprises the requisite power supply for the horizontal deflection circuit 40. The 112 volts is coupled through a dropping resistor R6 to the series combination of resistor R10 and capacitor C6 and through R10 and C6 to the collector of the horizontal drive transistor Q2. Q2 develops an alternating current in the primary winding of the horizontal driver transformer T1. The primary of T1 is connected between the collector of Q2 and the junction of R6 and R10. A secondary winding of T1 is connected to the horizontal output transistor Q3 and coupled through a resistor to ground. The collector of Q3 is coupled through a primary winding 31 of the flyback transformer T2 to the Horizontal B+.

In conventional television receivers the horizontal deflection circuit serves at least the dual purposes of driving both the horizontal deflection yoke (not shown) as well as the flyback transformer. During the latter portion of the trace period of the horizontal cycle the horizontal output transistor Q3 is conducting, thereby providing current for both the deflection yoke and the primary of the flyback transformer. During retrace Q3 is abruptly cut off, initiating retrace and resulting in an AC voltage of approximately 920 volts peak across the primary winding 31. This voltage is magnetically coupled to winding 32, producing a peak voltage of approximately 8 to 10 K volts across that winding. This voltage is then rectified and multiplied, that is, tripled by a tripler circuit (not shown), to provide the 25 or 30 Kilovolts required to operate the receiver's cathode ray tube.

Although a more or less conventional flyback transformer is depicted in FIG. 1, and its operation described above, it has been found advantageous to utilize a novel "integrated flyback" which incorporates the flyback and tripler circuitry in one unit. The integrated flyback comprises four windings, each separated by a diode. The 25 to 30 K High-voltage (the CRT anode voltage) is a direct output of the integrated flyback, thereby obviating the need for a discrete tripler circuit. A particular embodiment of an integrated flyback is shown as element 32' on FIG. 1.

In addition to deriving the high voltage supply from the flyback transformer, it has been found convenient to provide additional windings on the flyback transformer in order to accommodate the voltage supply requirements of other portions of the receiver's circuitry. In particular, winding 33 is used to develop a voltage supply for the receiver's video, chrominance and tuner circuits; winding 34 is used to develop a supply for the vertical deflection circuitry. Typically the waveforms across these windings are rectified and filtered, by respective diodes and capacitors as shown, to provide the desired supply voltages. A specific advantage of this configuration is that, these windings can be tailored to develop the appropriate voltages for the associated circuitry thereby conserving energy to substantially the maximum extent possible. However, as recited above, the operation of the horizontal oscillator is a prerequisite to the development of the isolated supply voltages derived from windings 33 and 34 of the flyback transformer; therefore, it is not possible to simply include another winding on the flyback transformer for the purposes of supplying a voltage to the horizontal oscillator. In addition, because of the power wasted, simply dropping the 112-volt Horizontal B+ to the voltage (20 volts) required by the oscillator, is a less than ideal situation.

Alternatively, a supply voltage for the horizontal oscillator is developed by including the customary input power transformer coupled to the AC line. However, it seems incongruous to provide an input isolation transformer for the horizontal oscillator when the primary purpose of a hot-chassis receiver is to avoid such a transformer. The startup circuit 50 of the subject invention presently to be described, represents a considerably more desirable configuration.

The startup supply includes resistor R51 and R52 connected between the Horizontal B+ and the collector and base electrodes, respectively, of a series-pass semiconductor device, transistor Q4. Q4 has an emitter electrode coupled through a diode D53 to the cathode of a zener diode D21. D21 serves to establish a regulated 20-volt supply for the horizontal oscillator. The cathode of D21 is also coupled through a series-connected diode D54 and resistor R55 to a 24-volt source derived from the flyback secondary winding. In a manner that will become apparent, diodes D53 and D54 form a steering network that determines which voltage source will supply current to the horizontal oscillator at its 20-volt power supply terminal. That is to say, the source of the current appearing at the steering network output, the junction of the cathodes of D53 and D54, depends on the relative voltages at network's inputs, the anodes of D53 and D54. The base of Q4 is also connected to the collector of transistor Q5 which has an emitter connected to the Hot ground. The base of Q5 is coupled through a series-connected resistor R56 and zener diode D57 to a 26-volt source, also derived from a secondary winding on the flyback transformer. The base of Q5 and the junction of R56 and D57 are respectively coupled by capacitors C58 and C59 to the Hot ground.

As indicated above, the function of the startup circuit 50 is to provide a voltage supply for the horizontal oscillator without significant degradation of the receiver's power consumption efficiency. This is accomplished by switching the oscillator supply from the Horizontal B+ during startup and to the +24-volt supply during steady-state operation, that is, when the voltages derived from the flyback secondary windings have reached values sufficient to assure sustained operation of the horizontal oscillator and hence of the entire deflection system.

Immediately subsequent to the energization of the receiver R52 will provide sufficient base current to drive Q4 into saturation. Because the 24-volt source will not have yet reached its steady-state value, the voltage on the anode of D53 will be greater than the voltage on the anode of D54 and Q4 will provide current through D53 to both D21 and the horizontal oscillator. Dropping resistor R51 lowers the collector voltage of, and hence the power dissipated by, Q4. Assuming a total Q4 emitter current of about 110 ma, corresponding to R51=820 ohms, approximately ten watts will be dissipated across R51, Q4 and D53 during the startup period.

After some interval of time, both the 24-volt and 26-volt derivative supplies will approach their nominal values. The 26-volt supply will reach a value sufficient to activate the startup detector comprising resistor R56, zener diode D57, and transistor Q5. This will happen when the voltage developed by the nominal 26-volt supply reaches a value greater than the breakdown voltage of D57. R56 and D57 will conduct current that will be the base drive to Q5 from the 26-volt supply. The current through R52 will be diverted from the base of Q4 to the collector of Q5. Q5 will approach saturation and the voltage at the base of Q4 will approach ground potential. The voltage at the anode of D54 will be greater than that at the anode of D53 and both Q4 and D53 will be rendered nonconducting. The horizontal oscillator will now be powered from the 24-volt flyback supply. During steady-state operation only approximately 0.34 watts will be dissipated across D54 and R55.

At this point it should be noted that switching the horizontal oscillator supply from the Horizontal B+ to the 24-volt flyback-derived source not only conserves input power but also considerably relaxes the wattage rating, and hence physical size and cost, of R51. For example, if the 20-volt oscillator supply were to be continuously drawn from the Horizontal B+, R51 would continuously dissipate approximately ten watts and would necessarily have a wattage rating at least equal to that. However, because in this invention R51 will conduct current only during a relatively brief startup period, lasting less than 0.5 second, a much smaller and less expensive 2-watt resistor can be safely used. In addition, although as shown in FIG. 1 and described above, two separate flyback-derived supplies are used with the power saving circuit 50, depending on the particular receiver voltage supply requirements, it will be possible to operate the circuit with only one flyback-derived supply. For instance, the 24-volt supply could be used to both power the horizontal oscillator as well as to provide an input to the startup detector.

Figure 2:
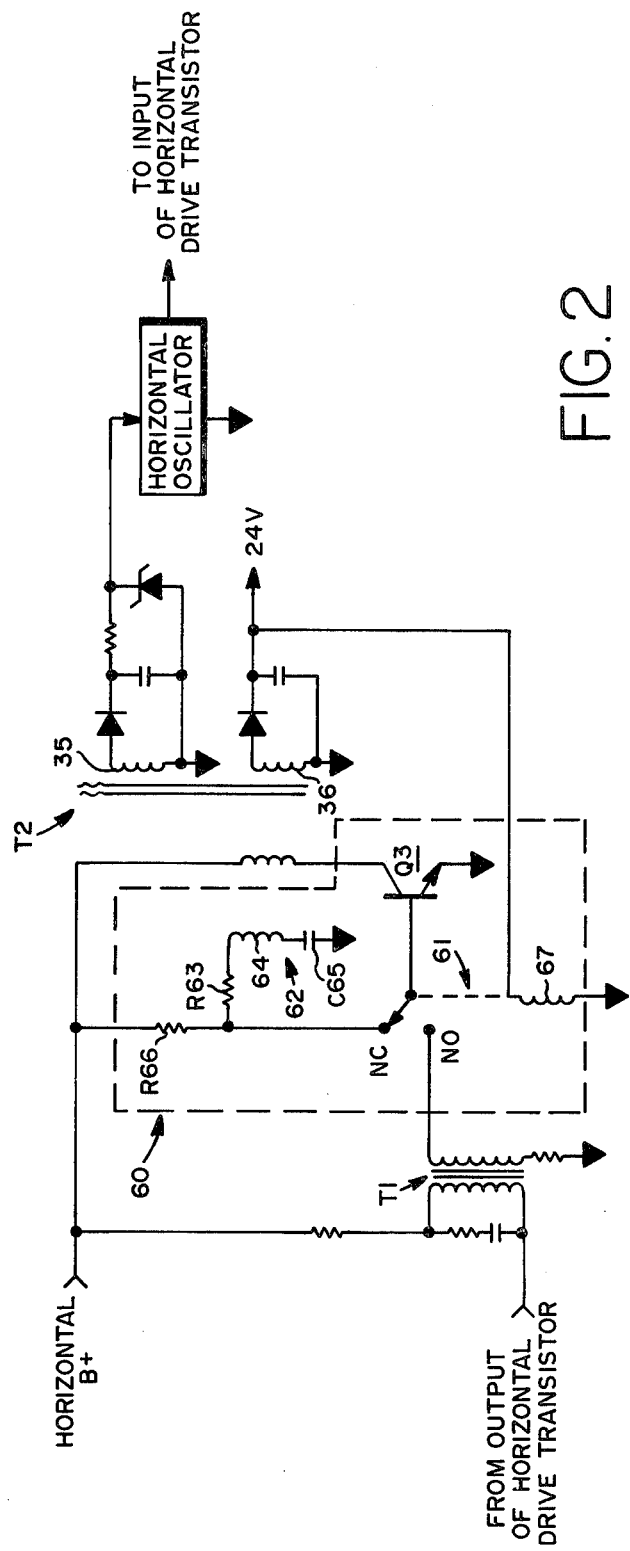
FIG. 2 is a schematic diagram of a receiver that effects startup through the use of a dual mode horizontal output device.

Another materially different scheme for effecting startup of the horizontal deflection system is illustrated in FIG. 2. As shown there the horizontal output stage 60, enclosed in dashed lines, comprises switching device 61 in the form of a SPDT relay with a common terminal, or pole, connected to the base electrode of an output device, transistor Q3. Q3 has an emitter electrode returned to the Hot ground. The normally open (NO) terminal of the relay is connected to the secondary of the horizontal interstage transformer T1. The normally closed (NC) terminal is coupled to the Hot ground through a feedback network comprising the series-connected resistance, resistor R63, inductance, winding 64, and capacitance, capacitor C65. The NC terminal is also coupled through bias means, in the form of resistor R66, to the Horizontal B+. The control winding 67 of relay 61 is coupled between the Hot ground and the 24-volt supply.

Immediately subsequent of the energization of the receiver the relay will be in its NC position. This is because, as before, the voltages derived from the flyback secondary windings, including the 24-volt supply, will not have reached their nominal values and the 24-volt supply will not be able to activate the relay.

Base current will be provided for Q3 bt R66. As shown in FIG. 2, the output of Q3 of stage 60, at the collector electrode, is coupled from the primary winding 31 of the flyback transformer to the winding 64. Winding 64 may consist of 10 turns of wire wound on the flyback core. As a result network 62 will provide the necessary amount of feedback from the collector output of Q3 to its input, that is, base, so that it operates in an oscillatory mode. With a winding 64 constructed as described and values for C65 and R63 equal to 0.18 microfarad and 39 ohms respectively, Q3 will oscillate at a frequency equal to approximately 22 KHz. The alternating current in the primary winding of 71 will induce voltages in both winding 35 and 36. At a time when the voltages provided by 26- and 24- volt supplies have reached levels such that sustained operation of the horizontal oscillator is assured, the voltage across winding 67 will be sufficient to activate relay 61, thereby connecting its NC terminal to the common terminal and in so doing connecting the base of Q3 to the secondary of T1. The horizontal output stage will then operate in the steady-state, switching mode in response to the signal developed by the horizontal oscillator.

It should be noted that although switching device 61 has been illustrated as an electrochemical device, a relay, it is obvious to those skilled in the art that it may take on many other forms, including various known semiconductor switching configurations without departing from the scope of the subject invention.

Accordingly, there has been shown and described what are at present considered the preferred embodiments of the invention, it will be obvious to those skilled in the art that various changes and modifications may be made therein without departing from the scope of the invention as defined by the appended claims.

What is claimed is:

1. A horizontal output stage for an Iso-Hot type television receiver, said output stage comprising:
   an output device having a first electrode coupled through a winding (31) of a flyback transformer to a source of voltage derived from the AC line and returned to a Hot ground and having a second electrode returned to the Hot ground;
   a switching device having a pole coupled to a third electrode of the output device, a control terminal coupled to a source of voltage derived from another winding (36) of the flyback transformer, and an NO terminal coupled to a horizontal interstage coupling means;
   bias means connected to an NC terminal of the switching device; and
   a feedback network connected to the NC terminal and coupled to winding 31, so that during startup the output device is connected to the NC terminal whereby it operates in an oscillatory mode and during steady-state it is connected to the NO terminal whereby it operates in a substantially switching mode, driven by a signal developed by the horizontal oscillator.

2. An output stage as defined in claim 1 wherein in the output stage comprises a transistor having:
   a collector coupled through the primary winding of the flyback transformer to a Horizontal B+ and an emitter returned to the Hot ground, and a base coupled to the pole of the switching device.

3. An output stage as defined in claim 1 wherein the switching device comprises a relay having a control winding connected between a source of voltage derived from a secondary winding on the flyback transformer and between the Hot ground.

4. An output stage as defined in claim 1 wherein the biasmeans comprises a resistor connected between the NC terminal and the source of voltage derived from the AC line.

5. An output stage as defined in claim 1 wherein the feedback means comprises a series-connected resistance, capacitance and inductance connected between the NC terminal of the switching device and the Hot ground.

6. An output stage as defined in claim 5 wherein the inductance comprises a fixed number of turns of wire wound on the flyback transformer core.

7. An output stage as defined in claim 2 wherein the switching device comprises a relay having a control winding connected between a source of voltage derived from a secondary winding on the flyback transformer and between the Hot ground.

8. An output stage as defined in claim 7 wherein the feedback means comprises a series-connected resistance capacitance and inductance connected between the NC terminal of the relay and the Hot ground.

9. An output stage as defined in claim 8 wherein the inductance comprises a fixed number of turns of wire wound on the flyback transformer core.

10. An output stage as defined in either claims 8 or 9 wherein the bias means comprises a resistor connected between the NC terminal of the relay and the Horizontal B+.

11. In a television receiver having a horizontal oscillator powered from a voltage supply derived from the flyback transformer, an improved horizontal output stage for effecting startup of the horizontal deflection system, the improvementcomprising a switching device having:
  a common terminal connected to the input of a horizontal device;
  an NC terminal connected to a feedback and bias network; and
  an NO terminal coupled to a horizontal interstage coupling circuit so that during startup conditions the output device is connected to the feedback and bias network and operates in an oscillatory mode whereby the flyback transformer develops a voltage sufficient to render the horizontal oscillator operational and during steady-state conditions the output device is connected to the horizontal interstage coupling circuit and operates in a switching mode whereby it is driven by signals developed by the horizontal oscillator.

12. An improvement as defined in claim 11 wherein the switching means has a control terminal at which is applied a voltage derived from a winding of the flyback transformer so that the switching means is rendered responsive to signals developed by the flyback transformer.

13. An improvement as defined in claim 12 wherein the feedback and bias means comprises an inductive element wound on the core of the flyback transformer.

14. An improvement as defined in claim 13 wherein the output device comprises a transistor having a collector connected to the flyback transformer, an emitter returned to ground, and a base coupled to the common terminal of the switching means.

15. A method of assuring startup of a horizontal deflection system having an oscillator powered from a supply derived from a flyback transformer winding comprising the steps of:
  coupling the input of the horizontal output device to a common terminal of a switching device;
  coupling a second terminal of the switching device to a horizontal interstage coupling circuit;
  coupling a third terminal of the switching device to a feedback network so that the output signal of the output device is coupled by the network to the third terminal of the switching device;
  coupling the control terminal of the switching device to a voltage derived from a flyback transformer winding so that when the voltage is below a predetermined value the input of the output device is coupled to the feedback network and the output device operates in an oscillatory mode and when the voltage is above the predetermined value the input of the output device is coupled to the interstage coupling circuit and the output device operates in a substantially switching mode, driven by a signal developed by the horizontal oscillator.

* * * * *